United States Patent
Aksin et al.

(10) Patent No.: US 7,233,275 B2
(45) Date of Patent: Jun. 19, 2007

(54) ANALOG-TO-DIGITAL CONVERTER WITH INPUT SIGNAL RANGE GREATER THAN SUPPLY VOLTAGE AND EXTENDED DYNAMIC RANGE

(75) Inventors: Devrim Y. Aksin, Dallas, TX (US); Mohammad A. Al-Shyoukh, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/280,086

(22) Filed: Nov. 16, 2005

(65) Prior Publication Data
US 2006/0202879 A1    Sep. 14, 2006

Related U.S. Application Data

(60) Provisional application No. 60/659,705, filed on Mar. 8, 2005.

(51) Int. Cl.
*H03M 1/34* (2006.01)

(52) U.S. Cl. .................................... 341/162; 341/155
(58) Field of Classification Search ......... 341/120–165
See application file for complete search history.

(56) References Cited

U.S. PATENT DOCUMENTS 7,078,677 B2 *   7/2006   Chong et al. .......... 250/231.18

* cited by examiner

*Primary Examiner*—Lam T. Mai
(74) *Attorney, Agent, or Firm*—Alan K. Stewart; W. James Brady; Frederick J. Telecky, Jr.

(57) ABSTRACT

An analog-to-digital converter device capable of measuring inputs beyond a supply voltage including: an N bit analog-to-digital converter powered by a supply voltage and a reference voltage; a range resolution stage capable of receiving inputs at higher voltages than the supply voltage, providing an input to the analog-to-digital converter, and outputting a logic value of one for the N+1th bit in response to an input signal higher than the reference voltage; and a bootstrapped input multiplexer stage for connecting low voltage input signals directly to the analog-to-digital converter and for connecting input signals that can exceed the supply voltage to the range resolution stage.

12 Claims, 2 Drawing Sheets

ANALOG-TO-DIGITAL CONVERTER WITH INPUT SIGNAL RANGE GREATER THAN SUPPLY VOLTAGE AND EXTENDED DYNAMIC RANGE

This application claims priority under 35 USC § 119 (e)(1) of provisional application No. 60/659,705 filed Mar. 08, 2005.

FIELD OF THE INVENTION

The present invention relates to electronic circuitry and, in particular, to an analog-to-digital converter with input signal range greater than supply voltage and extended dynamic range.

BACKGROUND OF THE INVENTION

Highly integrated power management applications often require the ability to measure voltage quantities that exceed the supply voltage in magnitude. This is primarily due to a basic need to maximize efficiency by running the power management IC on as low a supply voltage as possible, while still maintaining the ability to sample and measure quantities from the surroundings that could well exceed the battery voltage.

The problem can be defined as follows: Assume that there is a low power N bit SAR ADC working from a supply voltage Vdd and with a reference voltage equal to $V_{ref}$. $V_{ref}$ is usually equal to or slightly less than Vdd to maximize the input signal range of the ADC. The objective is to create an N+1 bit ADC which is capable of converting an input signal range from 0V to $2V_{ref}$. If $2V_{ref}$ happens to be greater than Vdd then this would present a problem. First of all, a reference voltage equal to $2V_{ref}$ has to be generated from Vdd. This would mean that a power-hungry charge pump would have to be built to create a high enough voltage from which this new reference voltage can be derived. Furthermore, the charge pump would have to bias all the complementary switches (transmission gates) to eliminate the forward biasing of any body diodes in the transmission gate switches. Building a charge pump also increases the noise on this desired $2V_{ref}$ reference, and an extra pin might be required for the charge pump's storage capacitor. Furthermore, the charge pump approach does not increase the effective number of bits (ENOB) by an additional bit and doubling the input signal range does not buy you an increase in ENOB, an often-desired thing when the input signal is increased. Other solutions that might involve resistor based voltage division to divide the input signal down to the 0 to $V_{ref}$ range would mean loading the input and possibly slowing down the conversion rate for resistor values that are high. This attenuation mechanism would render difficult an increase in the dynamic range, since the input signal gets divided down by the attenuation factor.

SUMMARY OF THE INVENTION

An analog-to-digital converter device capable of measuring inputs beyond a supply voltage including: an N bit analog-to-digital converter powered by a supply voltage and a reference voltage; a range resolution stage capable of receiving inputs at higher voltages than the supply voltage, providing an input to the analog-to-digital converter, and outputting a logic value of one for the N+1th bit in response to an input signal higher than the reference voltage; and a bootstrapped input multiplexer stage for connecting low voltage input signals directly to the analog-to-digital converter and for connecting input signals that can exceed the supply voltage to the range resolution stage.

DETAILED DESCRIPTION OF PREFERRED EMBODIMENTS

An analog-to-digital converter (ADC) topology, according to the present invention, capable of measuring inputs beyond the supply voltage is presented. In this topology the core of the ADC runs from a low power supply (thus consuming less power) while the input signal range is extended well above the supply voltage.

The present invention uses a power efficient way for extending the input signal range and effective number of bits that an ADC can provide. In other words an N bit ADC that operates on a voltage reference that is less than the supply voltage, and with an input signal range that is less than the supply voltage can be expanded to an N+1 bit ADC operating from the same power supply and reference but with an expanded input signal range that goes beyond the supply voltage. This expansion happens with minimal addition to power consumption and without any attenuation of the input signal.

The advantages are: 1. Increased effective number of bits the converter can provide; 2. Expanded Range for the input signal; 3. Super power-efficient operation, that is small compared to a similar ADC with the same effective number of bits but operating at a higher supply voltage; and 4. Economic to manufacture.

The topology of the present invention allows for extending the input signal range of the ADC beyond the supply voltage with minimal additional power consumption. Furthermore, the topology gives an extra bit in resolution transforming an N bit ADC to an N+1 bit ADC. The additional modules which allow for this expansion in the input signal range and effective number of bits of an ADC are small in size and present a small overhead in terms of die area. Furthermore, the performance gains are outstanding given that the input signal range is expanded beyond the supply voltage with which the ADC core runs.

The present invention provides a robust power-efficient way of expanding the input signal range of an ADC from reference voltage $V_{ref}$ to $2V_{ref}$ (two times reference voltage), while at the same time increasing the ADC ENOB (effective number of bits) by 1 bit from N bits to N+1 bits.

Figure 1:
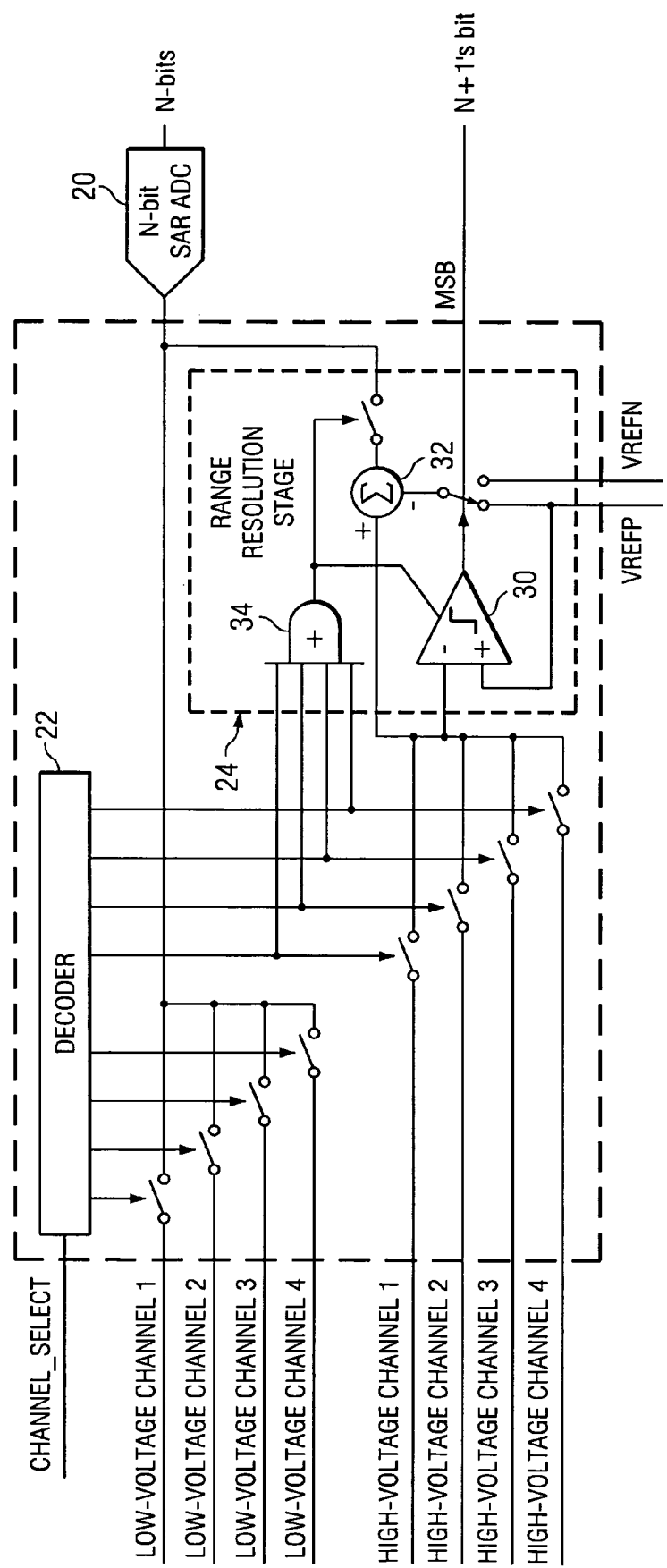
FIG. 1 is a block diagram of a preferred embodiment ADC topology.

FIG. 1 shows a block diagram of a preferred embodiment ADC topology. The topology consists of an N bit SAR ADC 20 powered by a supply voltage Vdd and with a reference voltage $V_{ref}$; a bootstrapped input multiplexer stage (decoder) 22; a range resolution stage 24; Low-Voltage input signal Channels 1–4 and High-Voltage Channels 1–4; decoder control signal Channel Select; reference voltages VREFP and VREFN, outputs N-bits and N+1's bit (MSB). The SAR ADC 20 is a standard N bit SAR ADC. The range resolution stage includes a comparator 30, a subtractor 32, and a logic gate 34.

Figure 2:
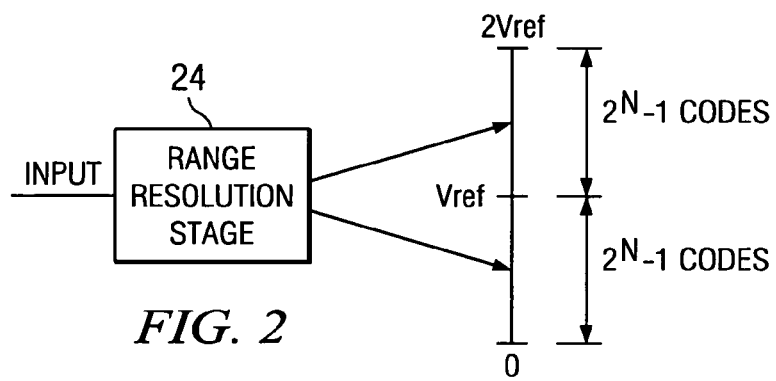
FIGS. 2 and 3 illustrate the dynamic range folding effect of the preferred embodiment of FIG. 1.
Figure 3:
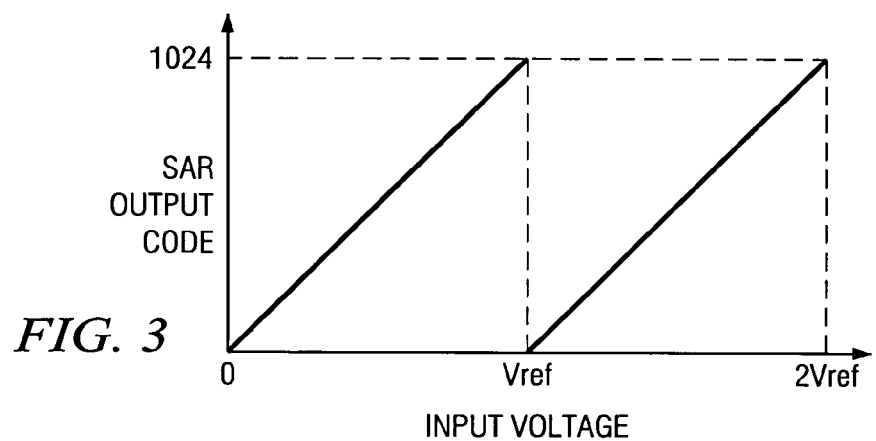

The bootstrapped inputs (High-Voltage Channel 1-High-Voltage Channel 4) are based on a bootstrapped switch capable of switching in inputs at higher voltages than supply voltage Vdd without turning on any body diodes. This is achieved at negligible power consumption levels. The range resolution stage 24 does the following: If the input signal is between a voltage level of 0 and $V_{ref}$ then that signal is directly fed to the N-bit ADC 20. If, on the other hand, the input signal is greater than voltage $V_{ref}$ then $V_{ref}$ gets subtracted from the signal before it is fed to the SAR ADC 20. This range resolution decision results in an extra bit of information and has the effect of creating two input ranges each of which is equal to $V_{ref}$ in magnitude. This input range folding effect is further illustrated in FIGS. 2 and 3. FIG. 2 shows the range resolution stage 24 and a scale of the ADC output codes from zero to $2V_{ref}$. FIG. 3 shows a plot of ADC output code versus the input voltage.

Figure 4:
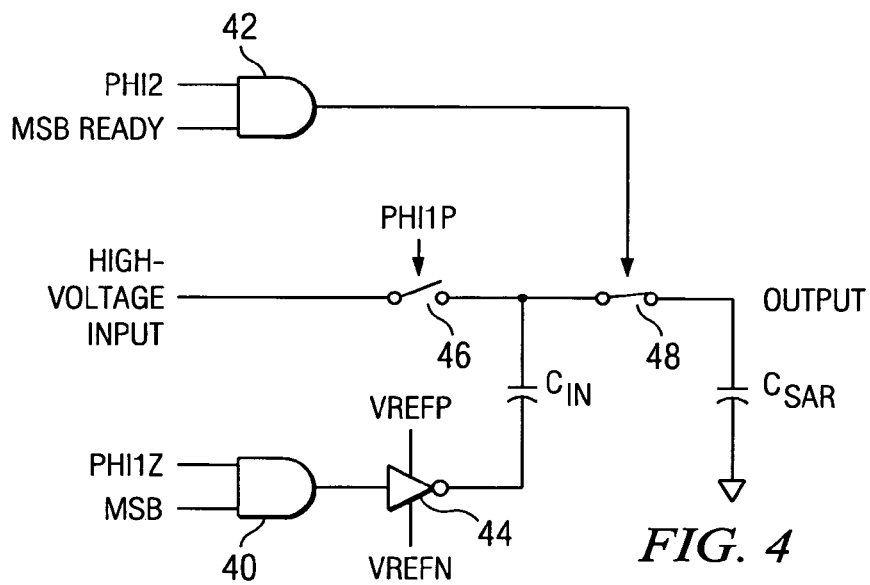
FIG. 4 is a circuit diagram of a passive subtractor block used in the preferred embodiment of FIG. 1.

Given the above information and the concept of input signal range folding, the following problem arises: For values of $V_{in}$ that are greater than $V_{ref}$, a solution to precisely subtract $V_{ref}$ from the input voltage within less than ½ LSB resolution is needed. The subtraction needs to take place without the use of active circuitry (that would have to run on a higher supply voltage) to take out $V_{ref}$ from $V_{in}$. The solution is presented in the passive subtractor block shown in FIG. 4. The passive subtractor shown in FIG. 4 includes And gates 40 and 42; inverter 44; capacitors CIN and CSAR; switches 46 and 48; most significant bit MSB; most significant bit ready signal MSB Ready; clock signals PHI2, PHI1Z, and PHI1P; high-voltage input signal; and output node. Inverter 44 and And gate 40 form a switchable reference voltage device. The passive subtractor serves as the subtractor block 32 shown in FIG. 1.

The passive subtractor uses a purely passive subtraction technique and requires a few clock cycles to complete the subtraction. The mechanics of its workings are as follows: If the range resolution block decides that the input voltage is greater than voltage $V_{ref}$, the bottom plate of capacitor $C_{in}$ is switched to voltage $V_{ref}$ (the voltage on node VREFP) instead of ground (voltage on node VREFN). When clock signal PHI1P is high the input voltage is being sampled on the top plate of capacitor $C_{in}$. When clock signal PHI1P goes low and clock signal PHI2 goes high the bottom plate of capacitor $C_{in}$ is switched to ground while the top plate of capacitor $C_{in}$ gets shorted to capacitor $C_{SAR}$ (the input capacitor of the SAR ADC). Switch 48 (connected between capacitors $C_{in}$ and $C_{SAR}$) and switch 46 (connected between the high voltage input and capacitor $C_{in}$) are implemented as bootstrapped NMOS switches. After a few clock cycles pass, the voltage on capacitor CSAR will settle to within ½ LSB of resolution after which the ADC switches from the sample mode to convert mode to convert the signal. The resulting N bits from this conversion, in addition to the extra bit generated by the range resolution stage add up to an N+1 bit result, while the range folding expands the input range from (0 to $V_{ref}$) to (0 to $2V_{ref}$). The range resolution stage comparator consumes much less current than the SAR main comparator. This is the only place where static current gets added to the overall current budget due to the dc biasing of the comparator. This additional current, however, is small and does not increase the power consumption by much. The bootstrapped switches and the passive subtractor blocks consume no static power, and the dynamic power they consume due to switching is negligible.

The preferred embodiment ADC topology is capable of resolving signals beyond the supply voltage. This topology is power efficient and increases the effective number of bits as the input signal range is expanded. The modules required to expand the dynamic range of an ADC according to this topology are small in size. The topology is robust and easily manufactured.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. An analog-to-digital converter device capable of measuring inputs beyond a supply voltage comprising:
    an N bit analog-to-digital converter powered by a supply voltage and a reference voltage;
    a range resolution stage capable of receiving inputs at higher voltages than the supply voltage, providing an input to the analog-to-digital converter, and outputting a logic value of one for an N+1th bit in response to an input signal higher than the reference voltage, wherein the range resolution stage comprises a comparator for determining if the input signal is higher than the reference voltage; and
    a bootstrapped input multiplexer stage (decoder) for switching input signals to the analog-to-digital converter and/or to the range resolution stage.

2. The device of claim 1 wherein the range resolution stage further comprises a subtractor for subtracting the reference voltage from the input voltage when the input voltage is greater than the reference voltage.

3. The device of claim 2 wherein the subtractor subtracts the reference voltage from the input voltage in response to the comparator.

4. The device of claim 2 wherein the subtractor is a passive subtractor device.

5. An analog-to-digital converter device capable of measuring inputs beyond a supply voltage comprising:
    an N bit analog-to-digital converter powered by a supply voltage and a reference voltage;
    a range resolution stage capable of receiving inputs at higher voltages than the supply voltage, providing an input to the analog-to-digital converter, and outputting a logic value of one for an N+1th bit in response to an input signal higher than the reference voltage, wherein the range resolution stage comprises a comparator for determining if the input signal is higher than the reference voltage; and
    a decoder for switching input signals to the analog-to-digital converter and/or to the range resolution stage in response to a channel select signal.

6. The device of claim 5 wherein the range resolution stage further comprises a subtractor for subtracting the reference voltage from the input voltage when the input voltage is greater than the reference voltage.

7. The device of claim 6 wherein the subtractor is a passive subtractor device.

8. The device of claim 7 wherein the passive subtractor device comprises:
    a first capacitor;
    a first switch coupled between a first plate of the first capacitor and an input node, and controlled by a first clock signal;
    a second switch coupled between the first plate of the first capacitor and an output node;

a second capacitor having a first plate coupled to the output node and a second plate coupled to ground; and a switchable reference voltage device for switching a second plate of the first capacitor from a ground voltage to the reference voltage.

9. The device of claim 8 wherein the switchable reference voltage device comprises:

an inverter having an output coupled to the second plate of the first capacitor, having a first supply node at the reference voltage, and having a second supply node at the ground voltage; and a logic gate having an output coupled to an input of the inverter, having a first input coupled to a most significant bit node, and having a second input coupled to a second clocking signal.

10. The device of claim 9 wherein the logic gate is an AND gate.

11. The device of claim 8 further comprising a logic gate for controlling the second switch, the logic gate having a first input node coupled to a most significant bit ready node and a second input node coupled to a third clocking signal.

12. The device of claim 11 wherein the logic gate is an AND gate.

* * * * *